(12) United States Patent
Liu et al.

(10) Patent No.: US 8,455,042 B2
(45) Date of Patent: Jun. 4, 2013

(54) METHOD FOR MAKING MATERIAL USEFUL IN OPTOELECTRONIC DEVICE, THE MATERIAL AND THE OPTOELECTRONIC DEVICE

(75) Inventors: Jie Liu, Niskayuna, NY (US); Qing Ye, Los Gatos, CA (US); Cheryl Louise Jones, East Berne, NY (US); Hideo Taka, Inagi (JP)

(73) Assignee: General Electric Company, Niskayuna, NY (US)

( * ) Notice: Subject to any disclaimer, the term of this patent is extended or adjusted under 35 U.S.C. 154(b) by 671 days.

(21) Appl. No.: 12/619,740

(22) Filed: Nov. 17, 2009

(65) Prior Publication Data

US 2011/0114923 A1  May 19, 2011

(51) Int. Cl.
*B05D 5/06* (2006.01)
*B05D 3/02* (2006.01)
*H01J 1/62* (2006.01)
*H01L 21/00* (2006.01)

(52) U.S. Cl.
USPC ............. 427/66; 427/352; 427/384; 427/553; 313/504; 438/29; 438/35

(58) Field of Classification Search
USPC ....... 427/66, 352, 384, 553; 313/504; 438/29, 438/35
See application file for complete search history.

(56) References Cited

U.S. PATENT DOCUMENTS

| 6,572,985 B2 | 6/2003 | Xie |
| 7,138,483 B2 | 11/2006 | Wang et al. |
| 2003/0116788 A1 | 6/2003 | Sakakibara et al. |
| 2007/0290194 A1* | 12/2007 | Becker et al. ................... 257/40 |
| 2008/0097076 A1 | 4/2008 | Radu et al. |

FOREIGN PATENT DOCUMENTS

| EP | 1753047 A2 | 2/2007 |
| JP | 2008047428 | 2/2008 |
| JP | 2008077856 | 4/2008 |
| WO | WO9806773 A1 | 2/1998 |
| WO | WO2006043087 A1 | 4/2006 |
| WO | WO2006043681 A1 | 4/2006 |
| WO | WO2008069756 A1 | 6/2008 |
| WO | WO2009107497 A1 | 3/2009 |

OTHER PUBLICATIONS

Xu et al., "Cyclic Arylamines as hole Transport Materials With High Thermal Stability for Efficient Electroluminescence", Thn Solid Films, vol. 516, pp. 7720-7726, 2008.
PCT International Search Report dated Jan. 27, 2011 and Written Opinion.

* cited by examiner

*Primary Examiner* — James Lin
(74) *Attorney, Agent, or Firm* — Mary Louise Stanford

(57) ABSTRACT

A method for making a material useful in an optoelectronic device comprises: providing a mixture of a polytriarylamine and a compound; forming a film of the mixture; and treating the film; wherein the compound comprises at least one functional group selected from arylamine and arylphosphine and at least two functional groups selected from vinyl, allyl, vinyl ether, epoxy, and acrylate. The materials made and the optoelectronic device are also provided.

11 Claims, 2 Drawing Sheets

METHOD FOR MAKING MATERIAL USEFUL IN OPTOELECTRONIC DEVICE, THE MATERIAL AND THE OPTOELECTRONIC DEVICE

BACKGROUND

The invention relates generally to methods for making materials useful, e.g., as hole-transport materials and/or electron-block materials of optoelectronic devices, the materials and the optoelectronic devices comprising the materials.

Optoelectronic devices, e.g. Organic Light Emitting Devices (OLEDs), which make use of thin film materials that emit light when subjected to a voltage bias, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs). Due to their high luminous efficiencies, OLEDs are seen as having the potential to replace incandescent, and perhaps even fluorescent, lamps for certain types of applications.

OLEDs possess a sandwiched structure, which consists of one or more organic layers between two opposite electrodes. For instance, multi-layered devices usually comprise at least three layers: a hole injection/transport layer, an emissive layer and an electron transport layer (ETL). Furthermore, it is also preferred that the hole injection/transport layer serves as an electron blocking layer and the ETL as a hole blocking layer. Single-layered OLEDs comprise only one layer of materials between two opposite electrodes.

BRIEF DESCRIPTION

In one aspect, the invention relates to a method for making a material, comprising: providing a mixture of a polytriarylamine and a compound; forming a film of the mixture; and treating the film; wherein the compound comprises at least one functional group selected from arylamine and arylphosphine and at least two functional groups selected from vinyl, allyl, vinyl ether, epoxy, and acrylate.

In another aspect, the invention relates to a material made by the above method.

In another aspect, the invention relates to an optoelectronic device comprising the above material.

In yet another aspect, the invention relates to a method for making an optoelectronic device, comprising: providing an electrode; providing a light emission layer; and providing between the electrode and the light emission layer a hole-transport layer comprising a material made by the above method.

DETAILED DESCRIPTION

Figure 1:
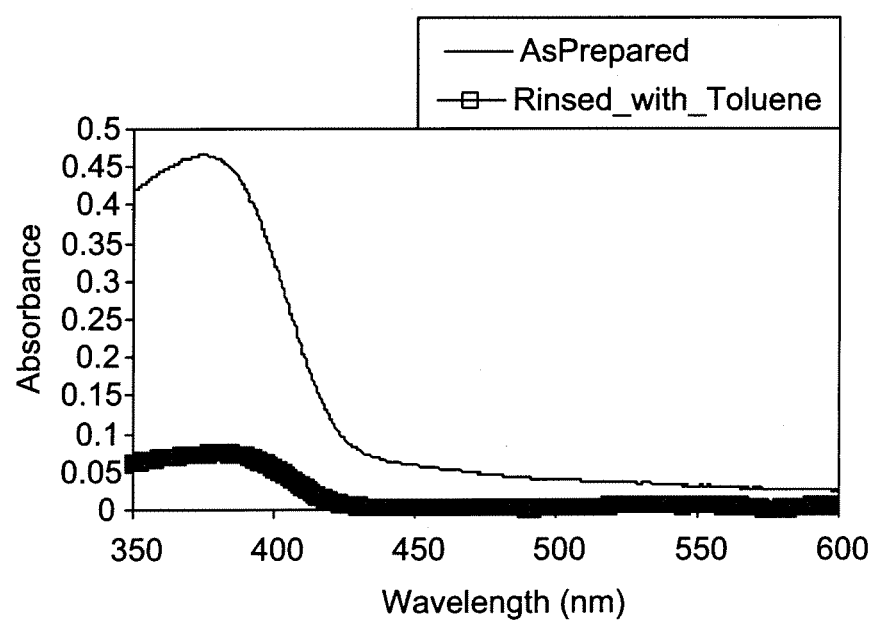
FIG. 1 shows UV-vis spectra of ADS254 as prepared and after rinsed with toluene.

In one aspect, the invention relates to a method for making a material, comprising: providing a mixture of a polytriarylamine and a compound; forming a film of the mixture; and treating the film; wherein the compound comprises at least one functional group selected from arylamine and arylphosphine and at least two functional groups selected from vinyl, allyl, vinyl ether, epoxy, and acrylate.

In another aspect, the invention relates to a material made by the above method.

In another aspect, the invention relates to an optoelectronic device comprising the above material.

In yet another aspect, the invention relates to a method for making an optoelectronic device, comprising: providing an electrode; providing a light emission layer; and providing between the electrode and the light emission layer a hole-transport layer comprising a material made by the above method.

In some embodiments, the mixture is a mixture solution of the polytriarylamine and the compound.

In some embodiments, the treating comprises treating the film under heat and/or photo radiation.

In some embodiments, the method further comprises rinsing the treated film.

In some embodiments, the polytriarylamine comprises structural unit of formula I

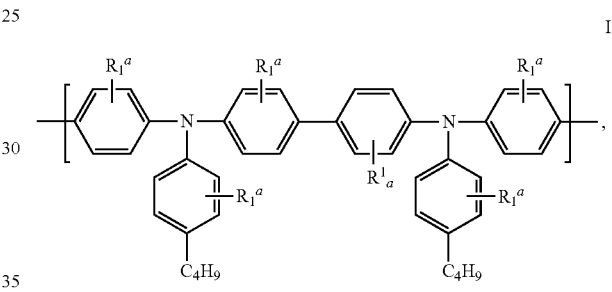

wherein $R^1$ is, independently at each occurrence, a $C_1$-$C_{20}$ aliphatic radical, a $C_3$-$C_{20}$ aromatic radical, or a $C_3$-$C_{20}$ cycloaliphatic radical; and a is, independently at each occurrence, an integer ranging from 0-4.

In some embodiments, the polytriarylamine comprises structural unit of formula II

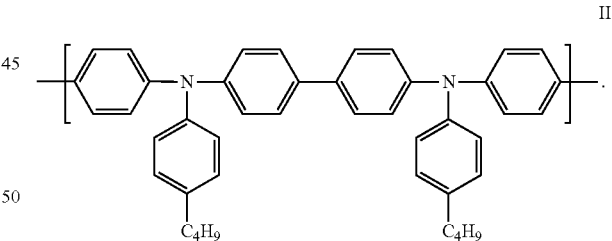

In some embodiments, the compound is of formula:

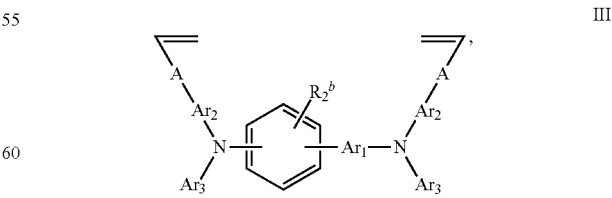

wherein $Ar_1$ is a direct bond, an aryl or heteroaryl;

$Ar_2$, and $Ar_3$ are, independently at each occurrence, an aryl or heteroaryl;

A is, independently at each occurrence, O or a direct bond;

$R_2$ is a $C_1$-$C_{20}$ aliphatic radical, a $C_3$-$C_{20}$ aromatic radical, or a $C_3$-$C_{20}$ cycloaliphatic radical; and
b is an integer ranging from 0-4.
In some embodiments, the compound is selected from:
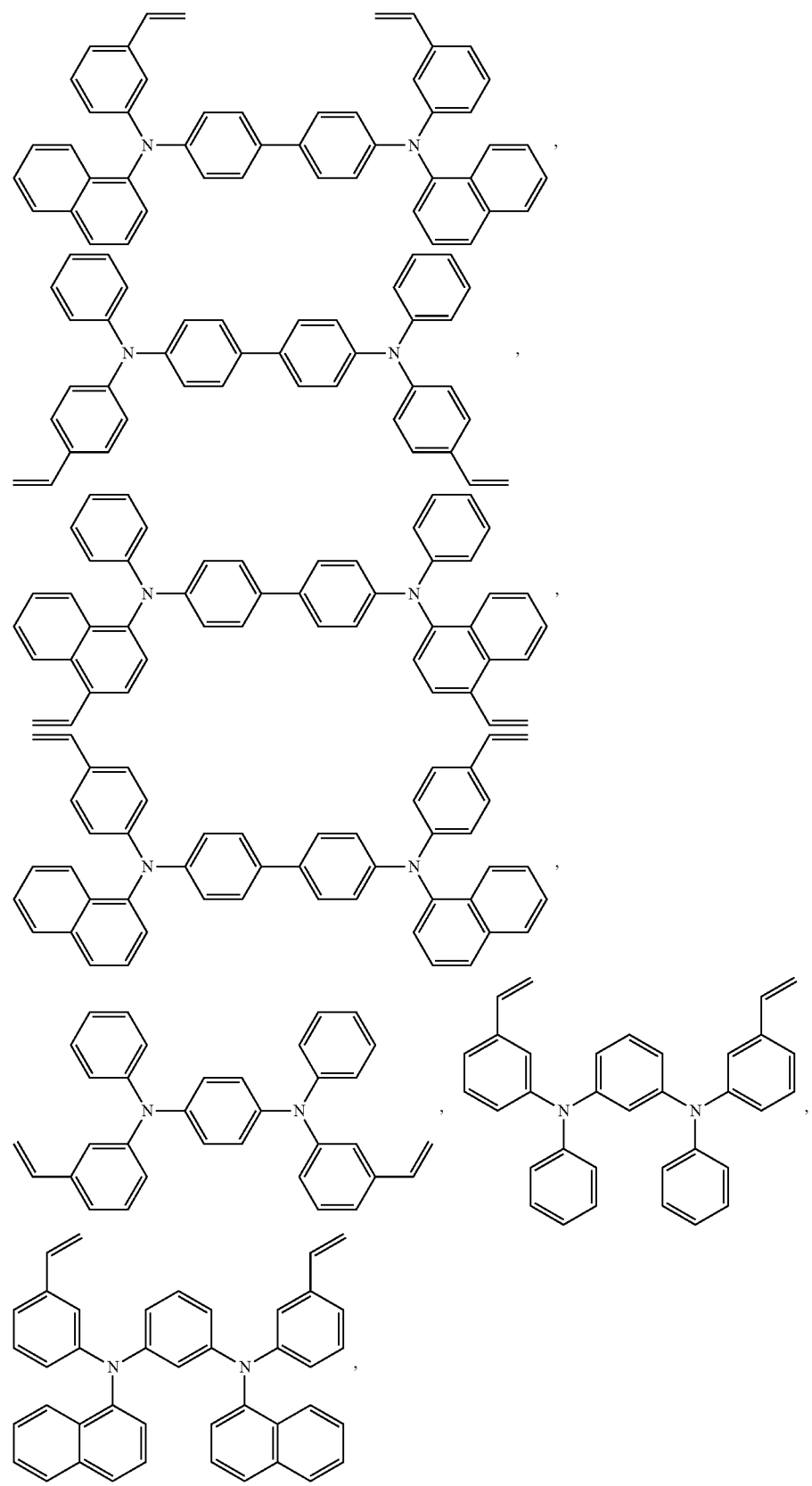

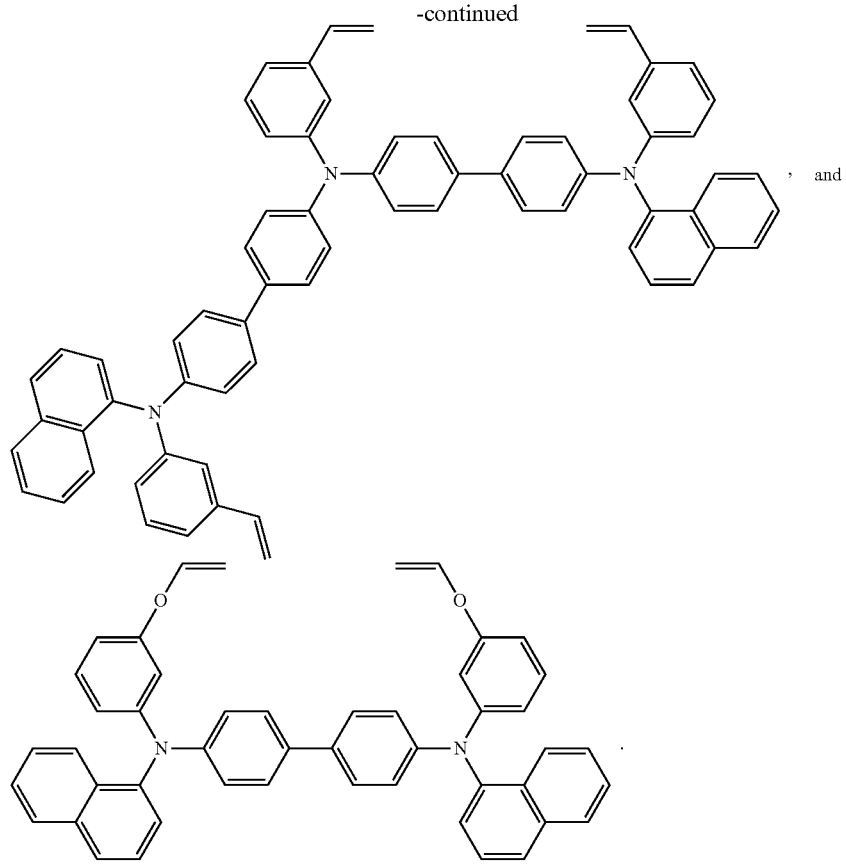
, and

In some embodiments, the polytriarylamine and the compound is 1:1 in weight ratio in the mixture solution.

Materials made herein are not soluble in solvents later applied in forming optoelectronic devices, such as organic light emitting devices (OLEDs) using solution processes and useful, e.g., in OLEDs, and are particularly well suited for use as hole-transport materials and/or electron-block materials for OLEDs.

An optoelectronic device, e.g., an OLED, typically includes in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet and/or triplet excitons decay to their ground states via radiative decay.

Other components which may be present in an OLED in addition to the anode, cathode and light emitting material include a hole injection layer, an electron injection layer, and an electron transport layer. The electron transport layer need not be in direct contact with the cathode, and frequently the electron transport layer also serves as a hole blocking layer to prevent holes migrating toward the cathode. Additional components which may be present in an organic light-emitting device include hole transporting layers, hole transporting emission (emitting) layers and electron transporting emission (emitting) layers.

In one embodiment, the OLEDs comprising the materials of the invention may be a fluorescent OLED comprising a singlet emitter. In another embodiment, the OLEDs comprising the materials of the invention may be a phosphorescent OLED comprising at least one triplet emitter. In another embodiment, the OLEDs comprising the polymers of the invention comprise at least one singlet emitter and at least one triplet emitter. The OLEDs comprising the materials of the invention may contain one or more, any or a combination of blue, yellow, orange, red phosphorescent dyes, including complexes of transition metals such as Ir, Os and Pt. In particular, electrophosphorescent and electrofluorescent metal complexes, such as those supplied by American Dye Source, Inc., Quebec, Canada may be used. The materials may be part of an emissive layer, or hole transporting layer or electron transporting layer, or electron injection layer of an OLED or any combination thereof.

The organic electroluminescent layer, i.e., the emissive layer or light emission layer, is a layer within an organic light emitting device which when in operation contains a significant concentration of both electrons and holes and provides sites for exciton formation and light emission. A hole injection layer is a layer in contact with the anode which promotes the injection of holes from the anode into the interior layers of the OLED; and an electron injection layer is a layer in contact with the cathode that promotes the injection of electrons from the cathode into the OLED; an electron transport layer is a layer which facilitates conduction of electrons from the cathode and/or the electron injection layer to a charge recombination site. During operation of an organic light emitting device comprising an electron transport layer, the majority of charge carriers (i.e. holes and electrons) present in the electron transport layer are electrons and light emission can occur through recombination of holes and electrons present in the emissive layer. A hole transporting layer is a layer which when the OLED is in operation facilitates conduction of holes from the anode and/or the hole injection layer to charge recombination sites and which need not be in direct contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. An electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode includes materials having a bulk resistivity of preferred about 1000 ohms per square, as measured by a four-point probe technique. Indium tin oxide (ITO) is frequently used as the anode because it is substantially transparent to light transmission and thus facilitates the escape of light emitted from electro-active organic layer. Other materials, which may be utilized as the anode layer, include tin oxide, indium oxide, zinc oxide, indium zinc oxide, zinc indium tin oxide, antimony oxide, and mixtures thereof.

Materials suitable for use as the cathode include general electrical conductors including, but not limited to metals and metal oxides such as ITO etc which can inject negative charge carriers (electrons) into the inner layer(s) of the OLED. Various metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a metal, such as aluminum or silver. In particular, the cathode may be composed of a single metal, and especially of aluminum metal.

Materials suitable for use in electron transport layers include poly(9,9-dioctyl fluorene), tris(8-hydroxyquinolato) aluminum (Alq3), 2,9-dimethyl-4,7-diphenyl-1,1-phenanthroline, 4,7-diphenyl-1,10-phenanthroline, 2-(4-biphenylyl)-5-(4-t-butylphenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

Materials made herein may be used in hole transporting layers in place of, or in addition to traditional materials such as 1,1-bis((di-4-tolylamino) phenyl)cyclohexane, N,N'-bis (4-methylphenyl)-N,N-bis(4-ethylphenyl)-(1,1'-(3,3'-dimethyl)biphenyl)-4,4'-diamine, tetrakis-(3-methylphenyl)-N, N,N',N-2,5-phenylenediamine, phenyl-4-N,N-diphenylamino styrene, p-(diethylamino)benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclo butane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylendioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371.

Materials suitable for use in the light emitting layer include electroluminescent polymers such as polyfluorenes, preferably poly(9,9-dioctyl fluorene) and copolymers thereof, such as poly(9,9'-dioctylfluorene-co-bis-N,N'-(4-butylphenyl) diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorephenyl)pyridinato-N,C2) (blue dye). Commercially available electrofluorescent and electrophosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Materials made herein may form part of the hole-transport layer or hole injection layer or light emissive layer of optoelectronic devices, e.g., OLEDs. The OLEDs may be phosphorescent containing one or more, any or a combination of, blue, yellow, orange, green, red phosphorescent dyes.

DEFINITIONS

As used herein, the term "aromatic radical" refers to an array of atoms having a valence of at least one comprising at least one aromatic group. The array of atoms having a valence of at least one comprising at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having $4n+2$ "delocalized" electrons where "n" is an integer equal to 1 or greater, as illustrated by phenyl groups ($n=1$), thienyl groups ($n=1$), furanyl groups ($n=1$), naphthyl groups ($n=2$), azulenyl groups ($n=2$), and anthraceneyl groups ($n=3$). The aromatic radical may also include nonaromatic components. For example, a benzyl group is an aromatic radical which comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehydes groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical comprising a methyl group, the methyl group being a functional group which is an alkyl group. Similarly, the 2-nitrophenyl group is a C6 aromatic radical comprising a nitro group, the nitro group being a functional group. Aromatic radicals include halogenated aromatic radicals such as 4-trifluoromethylphenyl, hexafluoroisopropylidenebis(4-phen-1-yloxy) (i.e., —OPhC(CF$_3$)$_2$PhO—), 4-chloromethylphen-1-yl, 3-trifluorovinyl-2-thienyl, 3-trichloro methylphen-1-yl (i.e., 3-CCl$_3$Ph-), 4-(3-bromoprop-1-yl)phen-1-yl (i.e., 4-BrCH$_2$CH$_2$CH$_2$Ph-), and the like. Further examples of aromatic radicals include 4-allyloxyphen-1-oxy, 4-aminophen-1-yl (i.e., 4-H$_2$NPh-), 3-aminocarbonylphen-1-yl (i.e., NH$_2$COPh-), 4-benzoylphen-1-yl, dicyanomethylidenebis(4-phen-1-yloxy) (i.e., —OPhC(CN)$_2$PhO—), 3-methylphen-1-yl, methylenebis(4-phen-1-yloxy) (i.e., —OPhCH$_2$PhO—), 2-ethylphen-1-yl, phenylethenyl, 3-formyl-2-thienyl, 2-hexyl-5-furanyl, hexamethylene-1,6-bis(4-phen-1-yloxy) (i.e., —OPh(CH$_2$)$_6$PhO—), 4-hydroxymethylphen-1-yl (i.e., 4-HOCH$_2$Ph-), 4-mercaptomethylphen-1-yl (i.e., 4-HSCH$_2$Ph-), 4-methylthiophen-1-yl (i.e., 4-CH$_3$SPh-), 3-methoxyphen-1-yl, 2-methoxycarbonylphen-1-yloxy (e.g. methyl salicyl), 2-nitromethylphen-1-yl (i.e., 2-NO$_2$CH$_2$Ph), 3-trimethylsilylphen-1-yl, 4-t-butyldimethylsilylphenl-1-yl, 4-vinylphen-1-yl, vinylidenebis(phenyl), and the like. The term "a C$_3$-C$_{20}$ aromatic radical" includes aromatic radicals containing at least three but no more than 20 carbon atoms. The aromatic radical 1-imidazolyl (C$_3$H$_2$N$_2$—) represents a C$_3$ aromatic radical. The benzyl radical (C$_7$H$_7$—) represents a C$_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group (C$_6$H$_{11}$CH$_2$—) is an cycloaliphatic radical which comprises a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylcyclopent-1-yl radical is a C$_6$ cycloaliphatic radical comprising a methyl group, the methyl group being a functional group which is an alkyl group. Similarly, the 2-nitrocyclobut-1-yl radical is a C$_4$ cycloaliphatic radical comprising a nitro group, the nitro group being a functional group. A cycloaliphatic radical may comprise one or more halogen atoms which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylcyclooct-1-yl, 2-chlorodifluoromethylcyclohex-1-yl, hexafluoroisopropylidene-2,2-bis(cyclohex-4-yl) (i.e., —C$_6$H$_{10}$C(CF$_3$)$_2$C$_6$H$_{10}$—), 2-chloromethylcyclohex-1-yl, 3-difluoromethylenecyclohex-1-yl, 4-trichloromethylcyclohex-1-yloxy, 4-bromodichloromethylcyclohex-1-ylthio, 2-bromoethylcyclopent-1-yl, 2-bromopropylcyclohex-1-yloxy (e.g. CH$_3$CHBrCH$_2$C$_6$H$_{10}$O—), and the like. Further examples of cyclo aliphatic radicals include 4-allyloxycyclohex-1-yl, 4-aminocyclohex-1-yl (i.e., H$_2$C$_6$H$_{10}$—), 4-aminocarbonylcyclopent-1-yl (i.e., NH$_2$COC$_5$H$_8$—), 4-acetyloxycyclohex-1-yl, 2,2-dicyanoisopropylidenebis(cyclohex-4-yloxy) (i.e., —OC$_6$H$_{10}$C(CN)$_2$C$_6$H$_{10}$O—), 3-methylcyclohex-1-yl, methylenebis(cyclohex-4-yloxy) (i.e., —OC$_6$H$_{10}$CH$_2$C$_6$H$_{10}$O—), 1-ethylcyclobut-1-yl, cyclopropylethenyl, 3-formyl-2-terahydrofuranyl, 2-hexyl-5-tetrahydrofuranyl, hexamethylene-1,6-bis(cyclohex-4-yloxy) (i.e., —OC$_6$H$_{10}$(CH$_2$)$_6$C$_6$H$_{10}$O—), 4-hydroxymethylcyclohex-1-yl (i.e., 4-HOCH$_2$C$_6$H$_{10}$—), 4-mercaptomethylcyclohex-1-yl (i.e., 4-HSCH$_2$C$_6$H$_{10}$—), 4-methylthiocyclohex-1-yl (i.e., 4-CH$_3$SC$_6$H$_{10}$—), 4-methoxycyclohex-1-yl, 2-methoxycarbonylcyclohex-1-yloxy(2-CH$_3$OCOC$_6$H$_{10}$O—), 4-nitromethylcyclohex-1-yl (i.e., NO$_2$CH$_2$C$_6$H$_{10}$—), 3-trimethylsilylcyclohex-1-yl, 2-t-butyldimethylsilylcyclopent-1-yl, 4-trimethoxysilylethylcyclohex-1-yl (e.g. (CH$_3$O)$_3$SiCH$_2$CH$_2$C$_6$H$_{10}$—), 4-vinylcyclohexen-1-yl, vinylidenebis(cyclohexyl), and the like. The term "a C$_3$-C$_{10}$ cycloaliphatic radical" includes cycloaliphatic radicals containing at least three but no more than 10 carbon atoms. The cycloaliphatic radical 2-tetrahydrofuranyl (C$_4$H$_7$O—) represents a C$_4$ cycloaliphatic radical. The cyclohexylmethyl radical (C$_6$H$_{11}$CH$_2$—) represents a C$_7$ cycloaliphatic radical.

As used herein the term "aliphatic radical" refers to an organic radical having a valence of at least one consisting of a linear or branched array of atoms which is not cyclic. Aliphatic radicals are defined to comprise at least one carbon atom. The array of atoms comprising the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" organic radicals substituted with a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a C$_6$ aliphatic radical comprising a methyl group, the methyl group being a functional group which is an alkyl group. Similarly, the 4-nitrobut-1-yl group is a C$_4$ aliphatic radical comprising a nitro group, the nitro group being a functional group. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl, difluorovinylidene, trichloromethyl, bromodichloromethyl, bromoethyl, 2-bromotrimethylene (e.g. —CH$_2$CHBrCH$_2$—), and the like. Further examples of aliphatic radicals include allyl, aminocarbonyl (i.e., —CONH$_2$), carbonyl, 2,2-dicyanoisopropylidene (i.e., —CH$_2$C(CN)$_2$CH$_2$—), methyl (i.e., —CH$_3$), methylene (i.e., —CH$_2$—), ethyl, ethylene, formyl (i.e. —CHO), hexyl, hexamethylene, hydroxymethyl (i.e. —CH$_2$OH), mercaptomethyl (i.e., —CH$_2$SH), methylthio (i.e., —SCH$_3$), methylthiomethyl (i.e., —CH$_2$SCH$_3$), methoxy, methoxycarbonyl (i.e., CH$_3$OCO—), nitromethyl (i.e., —CH$_2$NO$_2$), thiocarbonyl, trimethylsilyl (i.e., (CH$_3$)$_3$Si—), t-butyldimethylsilyl, 3-trimethyoxysilylpropyl (i.e., (CH$_3$O)$_3$SiCH$_2$CH$_2$CH$_2$—), vinyl, vinylidene, and the like. By way of further example, a C$_1$-C$_{20}$ aliphatic radical contains at least one but no more than 20 carbon atoms. A methyl group (i.e., CH$_3$—) is an example of a C$_1$ aliphatic radical. A decyl group (i.e., CH$_3$(CH$_2$)$_9$—) is an example of a C$_{10}$ aliphatic radical.

The term "heteroaryl" as used herein refers to aromatic or unsaturated rings in which one or more carbon atoms of the aromatic ring(s) are replaced by a heteroatom(s) such as nitrogen, oxygen, boron, selenium, phosphorus, silicon or sulfur. Heteroaryl refers to structures that may be a single aromatic ring, multiple aromatic ring(s), or one or more aromatic rings coupled to one or more non-aromatic ring(s). In structures having multiple rings, the rings can be fused together, linked covalently, or linked to a common group such as an ether, methylene or ethylene moiety. The common linking group may also be a carbonyl as in phenyl pyridyl ketone. Examples of heteroaryl rings include thiophene, pyridine, isoxazole, pyrazole, pyrrole, furan, imidazole, indole, thiazole, benzimidazole, quinoline, isoquinoline, quinoxaline, pyrimidine, pyrazine, tetrazole, triazole, benzo-fused analogues of these groups, benzopyranone, phenylpyridine, tolylpyridine, benzothienylpyridine, phenylisoquinoline, dibenzoquinozaline, fluorenylpyridine, ketopyrrole, 2-phenylbenzoxazole, 2 phenylbenzothiazole, thienylpyridine, benzothienylpyridine, 3 methoxy-2-phenylpyridine, phenylimine, pyridylnaphthalene, pyridylpyrrole, pyridylimidazole, and phenylindole.

The term "aryl" is used herein to refer to an aromatic substituent which may be a single aromatic ring or multiple aromatic rings which are fused together, linked covalently, or linked to a common group such as an ether, methylene or ethylene moiety. The aromatic ring(s) may include phenyl, naphthyl, anthracenyl, and biphenyl, among others. In particular embodiments, aryls have between 1 and 200 carbon atoms, between 1 and 50 carbon atoms or between 1 and 20 carbon atoms.

The term "alkyl" is used herein to refer to a branched or unbranched, saturated or unsaturated acyclic hydrocarbon radical. Suitable alkyl radicals include, for example, methyl, ethyl, n-propyl, i-propyl, 2-propenyl (or allyl), vinyl, n-butyl, t-butyl, i-butyl (or 2-methylpropyl), etc. In particular embodiments, alkyls have between 1 and 200 carbon atoms, between 1 and 50 carbon atoms or between 1 and 20 carbon atoms.

The term "cycloalkyl" is used herein to refer to a saturated or unsaturated cyclic non-aromatic hydrocarbon radical having a single ring or multiple condensed rings. Suitable cycloalkyl radicals include, for example, cyclopentyl, cyclohexyl, cyclooctenyl, bicyclooctyl, etc. In particular embodiments, cycloalkyls have between 3 and 200 carbon atoms, between 3 and 50 carbon atoms or between 3 and 20 carbon atoms.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

EXAMPLES

Comparative Example 1

Wash-Off Test on ADS254

ADS254 was purchased from American Dye Sources, Inc. and used as received. A 0.5 w/v % solution of ADS254 was prepared by dissolving 10 mg of ADS254 in 2.0 ml toluene. A thin film (30 nm in thickness) of ADS254 was then obtained by spin-casting the solution atop a pre-cleaned quartz substrate, and baked at 170° C. to remove residual solvent. A UV-vis absorption spectrometer was then used to record the absorbance of the film. Then the sample was rinsed with toluene by spin-casting toluene atop the film. Another UV-vis spectrum was taken.

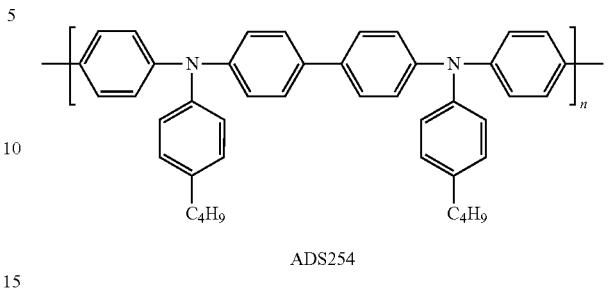

ADS254

As one can clearly see in FIG. 1, absorbance intensity peaking at 380 nm decreased from 0.293 for the sample as prepared to 0.04 upon rinsing with toluene, indicating that nearly 85% of ADS254 got washed off by toluene.

Example 1

Wash-Off Test on ADS254:Compound 1

Compound 1 was obtained from Konica Minolta Holdings, Inc., Tokyo, Japan. The experiment was conducted in a way similar to the comparative Example 1. A mixture solution of ADS254:compound 1 (50:50) was prepared by mixing 0.8 ml of 0.5 w/v % ADS254 in toluene and 0.8 ml of 0.5 w/v % compound 1 in toluene. A thin film (35 nm in thickness) of ADS254:compound 1 was then obtained by spin-casting, which was baked at 165° C. for 10 seconds and cured under UV (365 nm & 20 mW/cm2) for 30 seconds, further baked at 130° C. for 20 minutes. Then the sample was rinsed twice with toluene by spin-casting toluene atop the film. UV-vis spectra of the sample before/after each of the two rinsing steps were taken. Further, the sample was soaked with toluene for 2 minutes and another UV-vis spectrum (referred to as "3rd soaked & rinsed" in FIG. 2) was taken.

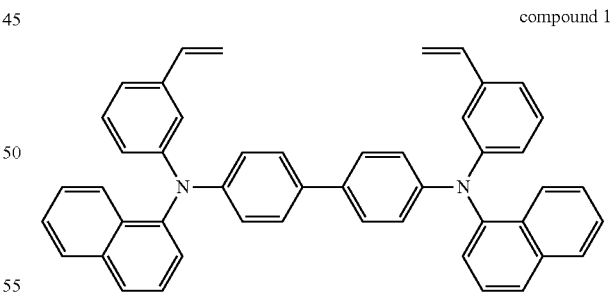

compound 1

Figure 2:
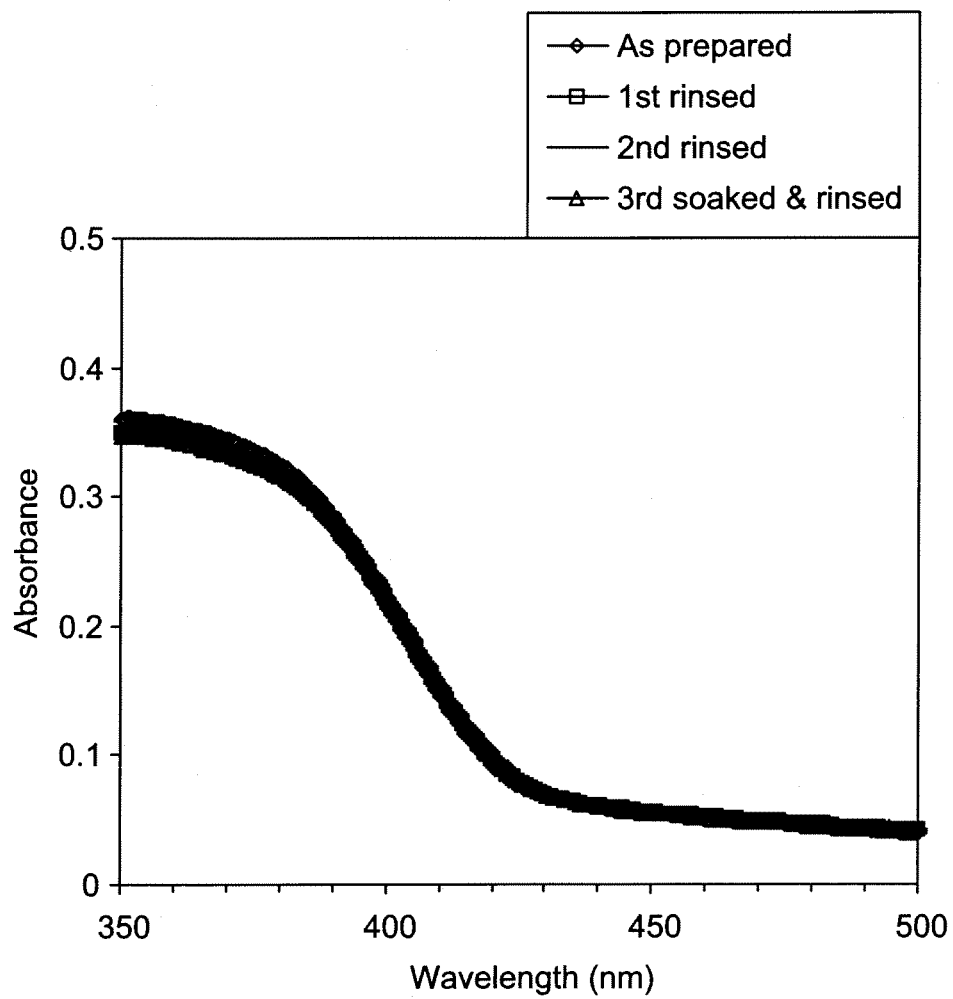
FIG. 2 illustrates UV-vis spectra of ADS254:compound 1 as prepared and after rinsed with toluene.

As one can easily see in FIG. 2, there is no detectable difference between the UV-vis spectra taken before and after all the rinsing steps, indicating that the film of ADS254: compound 1 as treated is not soluble in toluene any more.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for making a material comprising:
   forming a film from a solution of a polytriarylamine and a compound comprising at least one functional group selected from arylamine and arylphosphine and at least two functional groups selected from vinyl, allyl, vinyl ether, epoxy, and acrylate; and
   treating the film under heat and/or photoradiation;
   wherein
   the polytriarylamine comprises structural units of formula II

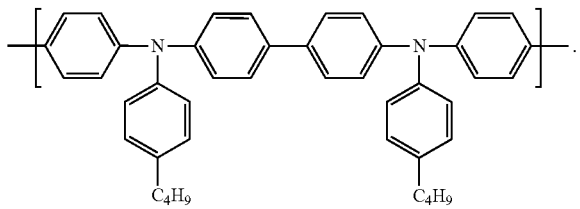

2. The method of claim 1, further comprising rinsing the treated film.

3. The method of claim 1, wherein the compound is of formula:

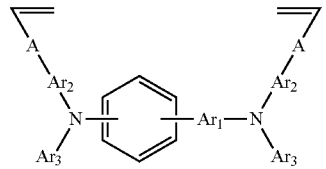

wherein
   $Ar_1$ is a direct bond, an aryl or heteroaryl;
   $Ar_2$, and $Ar_3$ are, independently at each occurrence, an aryl or heteroaryl; and
   A is, independently at each occurrence, O or a direct bond.

4. The method of claim 1, wherein the compound is selected from:

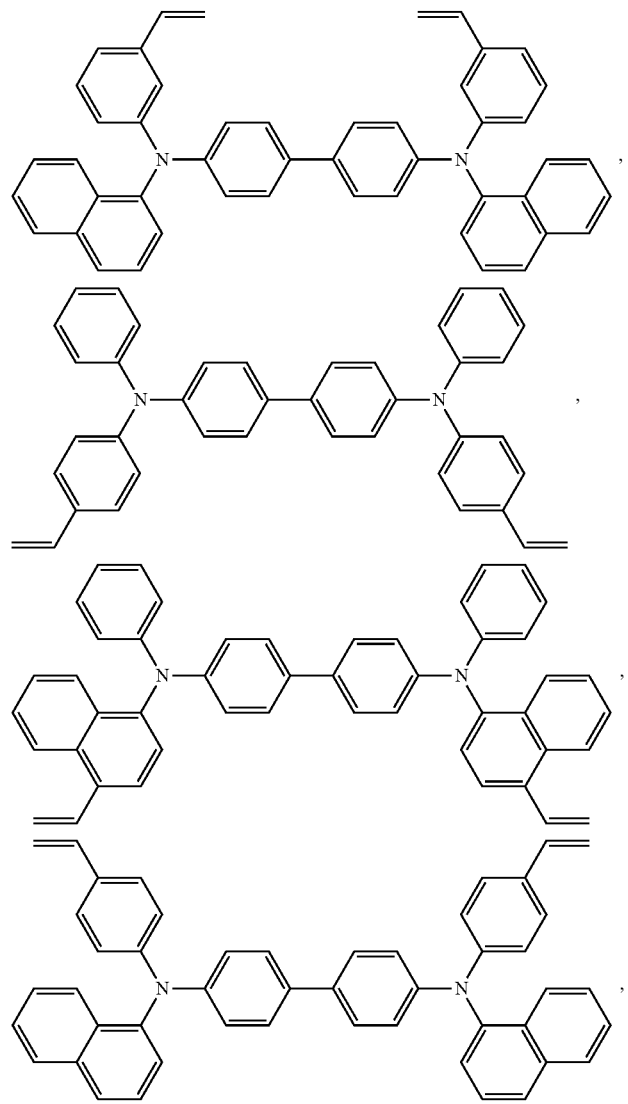

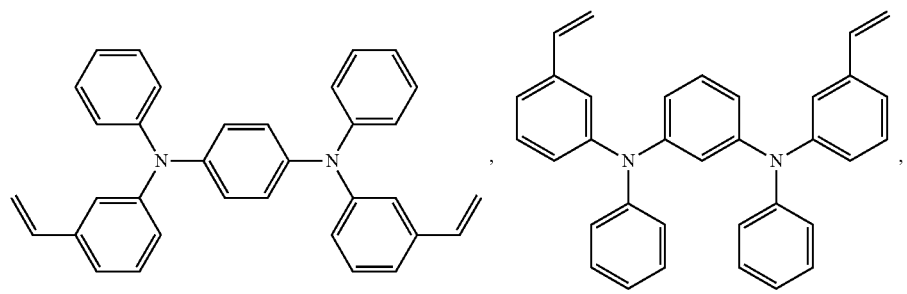
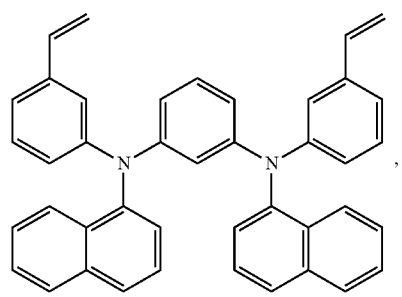
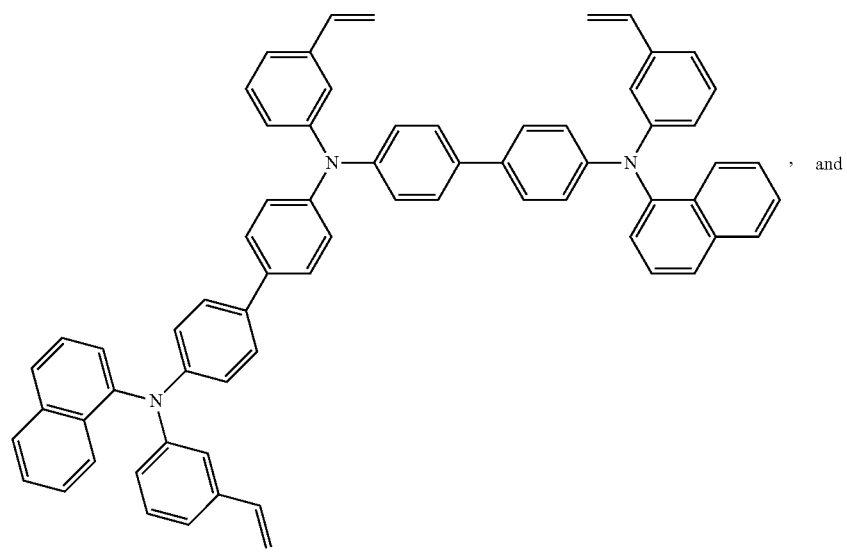
and
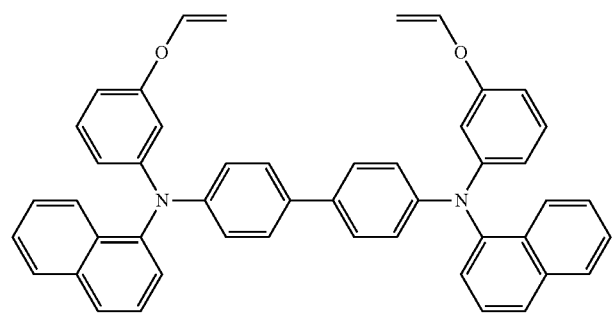

5. The method of claim 4, wherein the polytriarylamine and the compound is 1:1 in weight ratio in the solution.

6. A material made by the method of claim 1.

7. An optoelectronic device comprising a material made by the method of claim 1.

8. The optoelectronic device of claim 7, wherein the compound is of formula

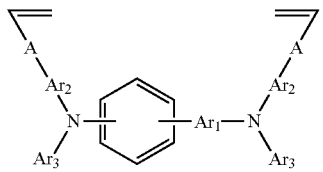

wherein

Ar$_1$ is a direct bond, an aryl or heteroaryl;

Ar$_2$, and Ar$_3$ are, independently at each occurrence, an aryl or heteroaryl;

A is, independently at each occurrence, O or a direct bond.

9. The optoelectronic device of claim 7, wherein the compound is selected from:

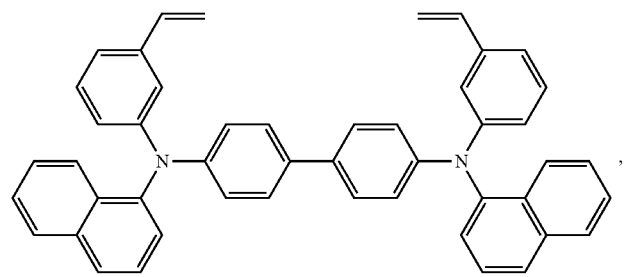

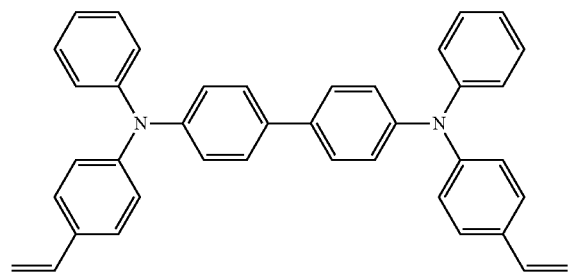

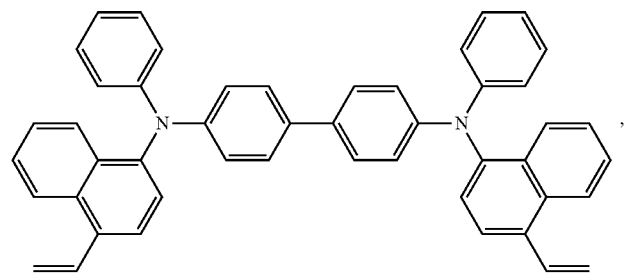

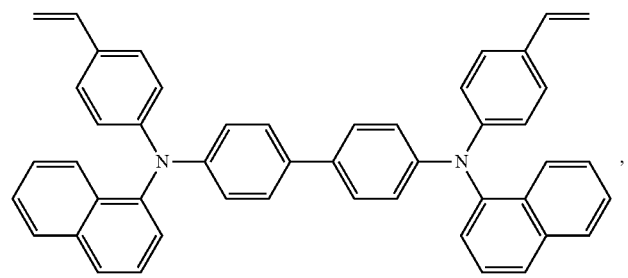

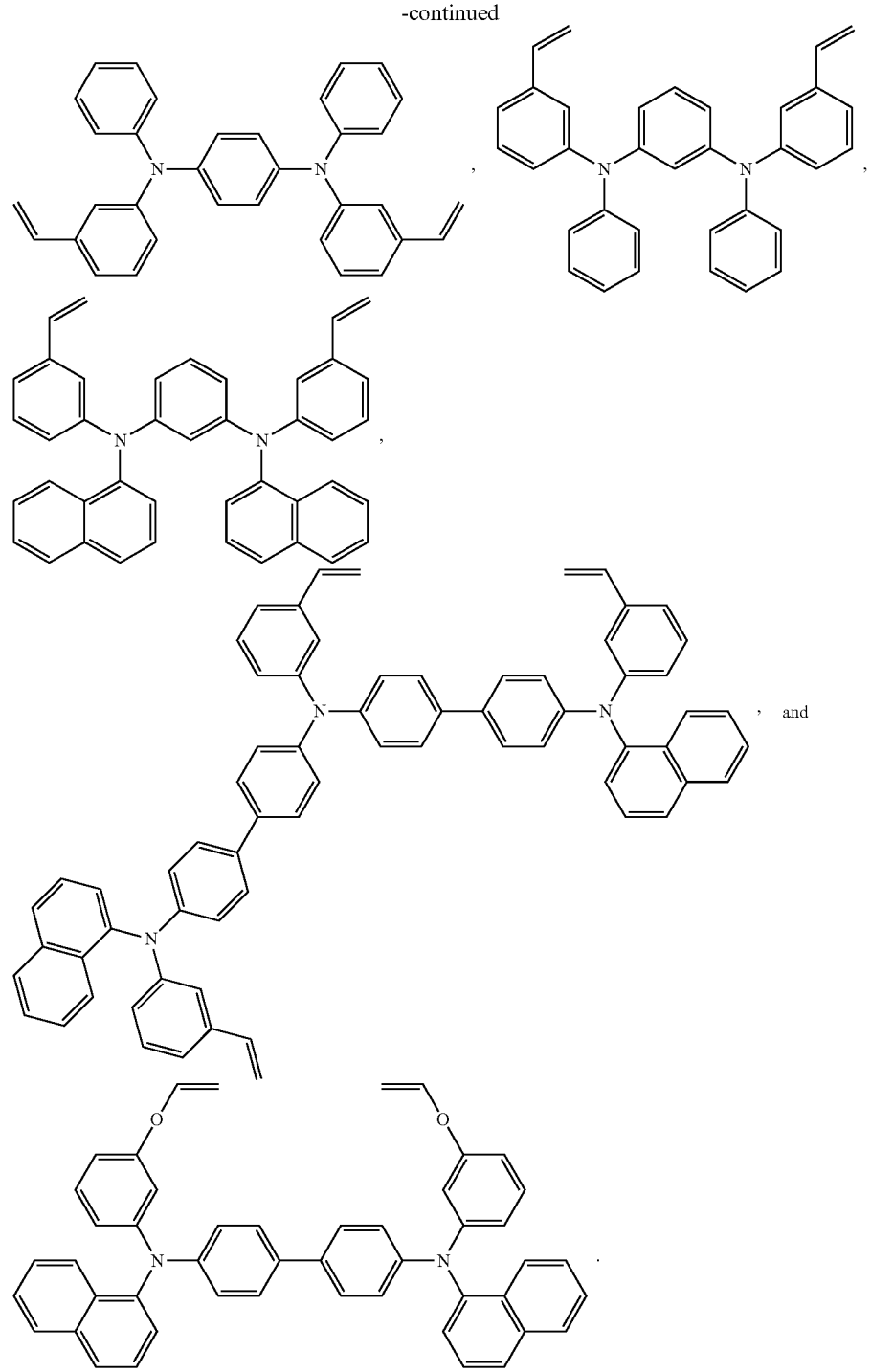

10. The optoelectronic device of claim 9, wherein the polytriarylamine and the compound is 1:1 in weight ratio in the solution.

11. A method for making an optoelectronic device, comprising:
providing an electrode;
providing a light emission layer; and
providing between the electrode and the light emission layer a hole-transport layer comprising a material made by the method of claim 1.

* * * * *